(12) United States Patent
Burns et al.

(10) Patent No.: US 8,053,368 B2
(45) Date of Patent: Nov. 8, 2011

(54) METHOD FOR REMOVING RESIDUES FROM A PATTERNED SUBSTRATE

(75) Inventors: Sean D. Burns, Hopewell Junction, NY (US); Matthew E. Colburn, Schenectady, NY (US); Steven J. Holmes, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 895 days.

(21) Appl. No.: 12/055,648

(22) Filed: Mar. 26, 2008

(65) Prior Publication Data

US 2009/0246958 A1 Oct. 1, 2009

(51) Int. Cl.
*H01L 21/311* (2006.01)

(52) U.S. Cl. ..... 438/694; 252/79.1; 252/79.2; 252/79.3; 252/79.4; 438/618; 438/637; 438/672; 430/270.1

(58) Field of Classification Search ........ 252/79.1–79.4; 438/618, 637, 672, 694; 430/270.1
See application file for complete search history.

(56) References Cited

U.S. PATENT DOCUMENTS

| 6,033,993 | A | * | 3/2000 | Love et al. ..... 438/745 |
| 6,492,075 | B1 | | 12/2002 | Templeton et al. |
| 6,844,131 | B2 | | 1/2005 | Oberlander et al. |
| 7,261,997 | B2 | | 8/2007 | Cox et al. |
| 7,749,904 | B2 | * | 7/2010 | Ho et al. ..... 438/672 |
| 2007/0243484 | A1 | * | 10/2007 | Chen et al. ..... 430/270.1 |

OTHER PUBLICATIONS

Eric K. Lin, et al. Science, vol. 297, (2002), pp. 372-375.*

* cited by examiner

*Primary Examiner* — Lan Vinh
*Assistant Examiner* — Maki Angadi
(74) *Attorney, Agent, or Firm* — Wenjie Li

(57) ABSTRACT

The present invention relates to a method for removing residues from open areas of a patterned substrate involving the steps of providing a layer of a developable anti-reflective coating (DBARC) over a substrate; providing a layer of a photoresist over said DBARC layer; pattern-wise exposing said photoresist layer and said DBARC layer to a radiation; developing said photoresist layer and said DBARC layer with a first developer to form patterned structures in said photoresist and DBARC layers; depositing a layer of a developer soluble material over said patterned structures; and removing said developer soluble material with a second developer.

20 Claims, 5 Drawing Sheets

METHOD FOR REMOVING RESIDUES FROM A PATTERNED SUBSTRATE

FIELD OF THE INVENTION

This invention relates to a photolithography process for semiconductor fabrication. More particularly, this invention is directed to a method for removing residues from open areas of a patterned substrate in a photolithography process.

BACKGROUND OF THE INVENTION

Photolithography is commonly used to make miniaturized electronic components such as integrated circuits in semiconductor manufacturing. In a photolithography process, a layer of photoresist is deposited on a substrate, such as a silicon wafer. The substrate is baked to remove any solvent remained in the photoresist layer. The photoresist is then selectively exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution to remove either the exposed portions of the photoresist for a positive photoresist or the unexposed portions of the photoresist for a negative photoresist. The patterned photoresist can then be used as a mask for subsequent fabrication processes on the substrate, such as deposition, etching, or ion implantation processes.

Advances in semiconductor device performance have typically been accomplished through a decrease in semiconductor device dimensions. The demand for ever smaller semiconductor device has made it necessary to use photolithographic techniques using imaging lights of shorter wavelengths such as 300 nm or less. However, the use of lights of shorter wavelengths for imaging has resulted in increased back reflection from substrates which are detrimental to the lithographic performance of photoresists.

To reduce the back light reflection from highly reflective substrates, prior art processes have typically used a highly absorbing bottom antireflective coating, generally referred to as BARC. A BARC is applied to a substrate and then a photoresist is deposited on top of the BARC layer. Most BARCs known in the prior art are designed to be removed by dry etch. That is, after the photoresist is pattern-wise exposed and developed to form patterned structures in the photoresist, portions of the BARC not covered by the photoresist are then etched away, thereby transferring the patterned structures to the BARC layer. The patterned structures in the photoresist and BARC layers are further transferred to the substrate by removing or by ion implanting portions of the substrate not covered by the photoresist and the BARC. However, dry etch removal of the BARC often causes thinning of the photoresist layer. Thus, if the etch rate of the BARC material and that of the photoresist are not well matched, the patterned structures in the photoresist may be damaged or not properly transferred into the substrate. In addition, the dry etch process may also cause damage to the substrate which will affect the performance of the final device.

Damage to the substrate during dry etch removal processes are especially detrimental to ion implant lithography. Historically, ion implant lithography has avoided the use of BARCs due to the need to implant species such as Arsenic (As), Boron (B) and Phosphorous (P) directly into the silicon surface of a semiconductor substrate. The dry etch processes used to remove a BARC layer could damage the silicon surface, usually by means of oxidation of the silicon surface. However, if the BARC layer is not removed completely prior to ion implanting, the BARC would serve to impede the implant species, causing variation in doping levels that would be harmful to device performance and reliability. On the other hand, it would be desirable to implement a BARC film in order to improve line-width control over the wafer topography which is normally present at the implant mask lithography step, and also to avoid possible resist residues related to the topography or interactions between the resist and the substrate.

Developable bottom antireflective coating (DBARC) materials have recently been introduced as an attempt to provide a film interposed between the photoresist and the substrate to act as an anti-reflective layer (for example, U.S. Pat. Nos. 6,844,131, 7,261,997, and U.S. Patent Application 2007/0243484). Unlike traditional BARC materials, DBARCs can be removed during the resist develop stage, thereby eliminating the dry etch removal step. While the DBARC materials show great promise for being used in ion implant lithography, they often exhibit residues which can block the implant species and degrade the devices. Thus, it is desired to develop processes to remove residues from a patterned substrate in conjunction with the use of DBARC materials in a photolithographic process.

SUMMARY OF THE INVENTION

The present invention provides a method to remove residues from open areas of a patterned substrate. The method of the invention is generally characterized by applying a layer of a developer soluble material applied on top of patterned structures in a photoresist, followed by removing the developer soluble material with a developer.

In one aspect, the present invention relates to a method for removing residues from open areas of a patterned substrate involving the steps of providing a layer of a developable bottom anti-reflective coating (DBARC) over a substrate; providing a layer of a photoresist over said DBARC layer; pattern-wise exposing said photoresist layer and said DBARC layer to a radiation; developing said photoresist layer and said DBARC layer with a first developer to form patterned structures in said photoresist and DBARC layers; depositing a layer of a developer soluble material over said patterned structures; and removing said developer soluble material with a second developer.

In another aspect, the present invention relates to a method for removing residues from open areas of a patterned substrate involving the steps of providing a layer of a developable bottom anti-reflective coating (DBARC) over a substrate; providing a layer of a photoresist over said DBARC layer; pattern-wise exposing said photoresist layer and said DBARC layer to a radiation; developing said photoresist layer and said DBARC layer with a first developer to form patterned structures in said photoresist and DBARC layers; depositing a layer of a developer soluble material over said patterned structures; baking said substrate to form an intermixing layer at an interface between said photoresist and said developer soluble material as well as between said DBARC and said developer soluble material; and removing said developer soluble material and said intermixing layer with a second developer.

In still another aspect, the present invention relates to a method for removing residues from open areas of a patterned substrate involving the steps of providing a layer of a bottom anti-reflective coating (BARC) over a substrate; providing a layer of a photoresist over said BARC layer; pattern-wise exposing said photoresist layer to a radiation; developing said photoresist layer with a first developer to form patterned structures in said photoresist layer, revealing a section of said BARC layer; depositing a layer of a developer soluble material over said patterned structures and said revealed section of said BARC layer; baking said substrate such that at least a portion of said exposed section of said BARC layer is rendered soluble in a second developer; and removing said developer soluble material and said at least portion of the revealed section of said BARC layer with said second developer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF THE PREFERRED EMBODIMENTS

Figure 1A:
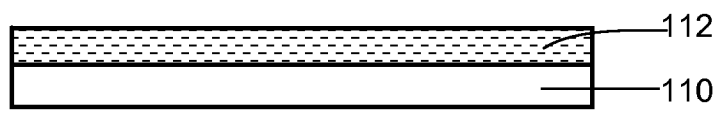
FIGS. 1a-1e illustrate cross-sectional views showing processing steps for removing residues from open areas of a patterned substrate using a developer soluble material in accordance with one embodiment of the present invention.

In describing the preferred embodiments of the present invention, reference will be made herein to FIGS. 1a-1e, 2a-2f, 3a-3f, 4a-4b and 5a-5b of the drawings in which like numerals refer to like features of the invention. Features of the invention are not necessarily shown to scale in the drawings.

The present invention involves using a developer soluble material to remove residues from open areas of a patterned substrate. The developer soluble material is a material soluble in any developer suitable for a photolithographic process. Such a developer includes aqueous solutions, base solutions, acid solutions, and organic solvents. The developer soluble material includes water soluble polymers, base soluble polymers, acid soluble polymers, and organic solvent soluble polymers. The developer soluble material may also include acid compounds and base compounds. In one embodiment, the developer soluble material includes a polymer containing an acidic group. Examples of suitable acidic groups include, but are not limited to, carboxylic acid, fluoroalcohol, and fluorosulfonamide. In another embodiment, the developer soluble material includes an acid compound. Specific examples of the acid compound include sulfonic acids, carboxylic acids, and polycarboxylic acids and mixtures thereof. In still another embodiment, the developer soluble material includes a base compound. Specific examples of the base compound include alkaline metal, alkaline earth metal and ammonium hydroxides, silicates, phosphates, borates, carbonates, and amines and mixtures thereof. It is preferred that the developer soluble material is soluble in aqueous alkaline developers. More preferably, the developer soluble material is soluble in a tetramethylammonium hydroxide (TMAH) developer solution.

The developer soluble material may further include at least one solvent. The solvent is preferably immiscible with the underlying photoresist and DBARC materials. Suitable solvents include, but are not limited to, 1-butanol, methanol, ethanol, 1-propanol, ethylene glycol, 1,2-butanediol, 1,3-butanediol, 1,4-butanediol, 1,2-propanediol, 1,3-propanediol, and 4-methyl 1-pentanol. In one embodiment, the developer soluble materials are top coat materials commonly used at 193 nm immersion lithography.

Initially, a layer of a DBARC is formed over a substrate. The substrate in the present invention is suitably any substrate conventionally used in processes involving photoresists. For example, the substrate can be silicon, silicon oxide, aluminum-aluminum oxide, gallium arsenide, ceramic, quartz, copper or any combination thereof including multilayers.

Any DBARC material conventionally used in a photolithographic process may be employed in the present invention. In one embodiment, the DBARC material is soluble in an aqueous alkaline developer. In another embodiment, the DBARC material is initially insoluble in the aqueous alkaline developer, but becomes soluble after exposure and bake. The DBARC may be applied by virtually any standard means including spin coating. The substrate with the DBARC layer may be baked to remove any solvent from the DBARC material and improve the coherence of the DBARC layer. The preferred range of the bake temperature for the DBARC layer is from about 70° C. to about 190° C., more preferably from about 150° C. to about 170° C. A typical bake time is from about 60 seconds to about 90 seconds. The preferred range of thickness of the DBARC layer is from about 20 nm to about 100 nm, more preferably from about 40 nm to about 60 nm.

Next, a layer of a photoresist is applied over the DBARC layer. The photoresist layer in the present invention may be formed from any photoresist conventionally used in semiconductor industry. Preferably, the photoresist is a chemically amplified resist, such as a 193 nm or 248 nm photoresist. Both positive-tone resists and negative-tone resists are suitable to be used in the present invention. The photoresist may be applied by virtually any standard means including spin coating. The substrate with the photoresist layer may be baked (PAB) to remove any solvent from the photoresist and improve the coherence of the photoresist layer. The preferred range of the PAB temperature for the photoresist layer is from about 70° C. to about 150° C., more preferably from about 90° C. to about 130° C. A typical bake time is from about 60 seconds to about 90 seconds. The preferred range of thickness of the photoresist layer is from about 20 nm to about 400 nm, more preferably from about 50 nm to about 300 nm.

The substrate is then exposed pattern-wise to a radiation. Preferably, the pattern-wise exposure is accomplished through a patterned mask. The patterned masks employed in the present invention can be any photomasks commonly used in photolithographic processes including attenuated phase shift masks (PSMs). The radiation employed in the present invention can be visible light, ultraviolet (UV), extreme ultraviolet (EUV) and electron beam (E-beam). In one exemplary embodiment, the imaging wavelength of the radiation is about 193 nm. In another exemplary embodiment, the imaging wavelength of the radiation is about 248 nm.

In one embodiment, the exposed substrate is baked (post exposure bake, or PEB) to promote the chemical reaction in the photoresist and/or to improve the coherence of the photoresist and coating layers. Preferred PEB temperature is from about 70° C. to about 120° C., more preferably from about 90° C. to about 110° C. In some instances, it is possible to avoid the PEB step since for certain chemistries, such as acetal and ketal chemistries, deprotection of the resist polymer proceeds at room temperature.

The exposed photoresist and DBARC layers are developed with a first developer to form patterned structures in the photoresist and DABRC layers. That is, the exposed substrate is contacted with a developer to remove portions of the photoresist layer and portions of the underlying DBARC layer in one step. It is preferred that the first developer is an aqueous alkaline developer. More preferably, the first developer is a TMAH solution. It is further preferred that the concentration of the TMAH solution is about 0.2 N to about 0.3 N. The first developer may further comprise additives, such as surfactants, polymers, isopropanol, ethanol, etc.

A developer soluble material is next deposited over the patterned structures in the photoresist and DBARC layers. It is preferred that the developer soluble material is deposited over the photoresist and the underlying DBARC in a manner that it covers or at least substantially covers the features of the patterned structures. For example, if the patterned structure is comprised of a plurality of lines and trenches, then the developer soluble material fills or substantially fills the trenches between the lines and covers the lines of the patterned structure or just reaches the tops of the lines of the patterned structure.

Optionally, the substrate is baked after the developer soluble material is deposited. The bake process can remove any solvent from the developer soluble material and improve the coherence of the developer soluble material layer. In one embodiment, during the bake process, a thin intermixing layer is formed at an interface between the photoresist layer and the developer soluble material layer as well as between the DBARC layer and said developer soluble material layer. The thickness of the thin intermixing layer is from about 2 nm to about 30 nm. In another embodiment, the acid compound from the developer soluble material layer diffuses into a thin portion of the photoresist and DBARC layers adjacent the developer soluble material layer and renders the thin portion soluble in an aqueous alkaline developer. Preferred bake temperature is from about 60° C. to about 250° C., more preferably from about 120° C. to about 150° C. A typical bake time is from about 60 seconds to about 90 seconds.

The coating of the developer soluble material and the thin intermixing layer or the thin portion of the photoresist and DBARC layers adjacent the developer soluble material layer are removed from the substrate using any suitable means, such as using a second developer. It is preferred that the second developer is an aqueous alkaline developer. More preferably, the second developer is a TMAH solution. It is further preferred that the concentration of the TMAH solution between about 0.2 N to about 0.3 N. The second developer may further comprise additives, such as surfactants, polymers, isopropanol, ethanol, etc. In one embodiment, the second developer and the first developer are the same material.

The patterned structures formed in the photoresist and DBARC layers in the present invention can be further transferred to the substrate by removing or by ion implanting portions of the substrate not covered by the photoresist and the DBARC. Typically, portions of the substrate are removed by reactive ion etching or some other technique known to one skilled in the art. The method of the invention may be used to create patterned structures such as metal wiring lines, holes for contacts or vias, insulation sections (e.g., damascene trenches or shallow trench isolation), trenches for capacitor structures, etc. as might be used in the design of integrated circuit devices.

In the present invention, it is possible that a regular BARC material can be used to replace the DBARC material. After the photoresist is exposed and developed, a section of the BARC layer is revealed. A developer soluble material layer is then deposited over the patterned structures in the photoresist and the revealed section of the BARC layer. The substrate is baked. In one embodiment, during the bake process, an intermixing layer is formed at an interface between the BARC layer and the developer soluble material layer. In another embodiment, the acid compound from the developer soluble material layer diffuses into at least a portion of the BARC layer adjacent the developer soluble material layer and renders the portion soluble in an aqueous alkaline developer. The developer soluble material layer and the intermixing layer or the portion of the BARC layer adjacent the developer soluble material layer are removed from the substrate using a second developer.

It is further possible that the steps of depositing of the layer of the developer soluble material and removing the developer soluble material with the second developer can be repeated if necessary.

Figure 1B:
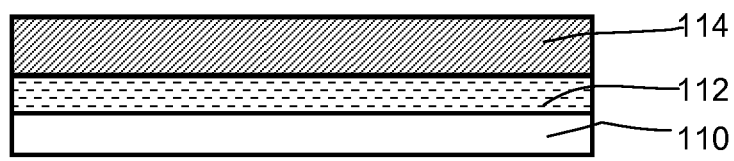
Figure 1C:
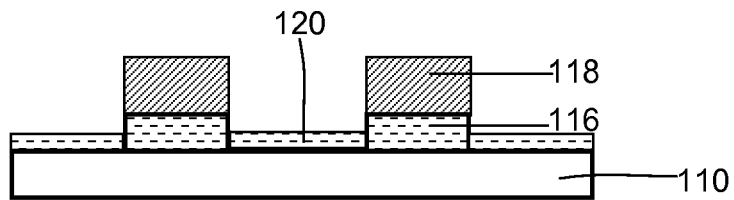
Figure 1D:
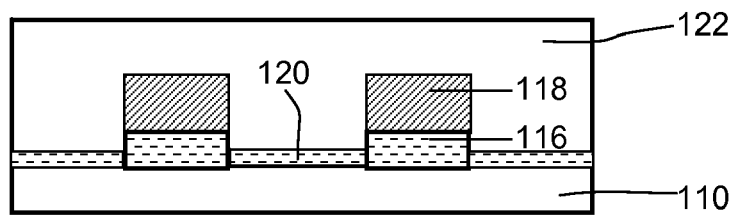
Figure 1E:
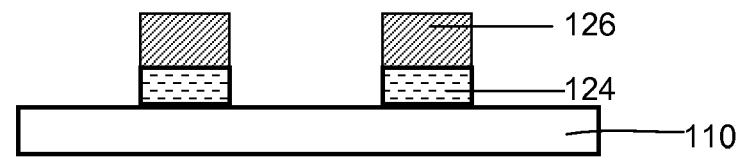

Three specific embodiments of the method of the present invention are now described in connection with Figures. In one embodiment, a DBARC material is first applied to substrate 110 to provide a DBARC layer 112 (FIG. 1a). A photoresist layer 114 is then applied over the DBARC layer 112 (FIG. 1b). The substrate is pattern-wise exposed to a radiation and then developed with a first developer to form patterned structures 118 and 116 in the photoresist and DBARC layers (FIG. 1c). In FIG. 1c, DBARC residues 120 are primarily present in the open trench areas between the lines of the patterned structures. In FIG. 1d, a layer of a developer soluble material 122 is deposited over the patterned structures in the photoresist and DBARC layers. A second developer is then used to remove the developer soluble material layer 122 and the DBARC residues 120 from the substrate, leaving patterned structures 126 and 124 in the photoresist and DBARC layers (FIG. 1e).

Figure 2A:
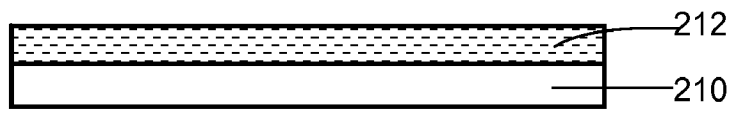
FIGS. 2a-2f illustrate cross-sectional views showing processing steps for removing residues from open areas of a patterned substrate using a developer soluble material for in accordance with another embodiment of the present invention.
Figure 2B:
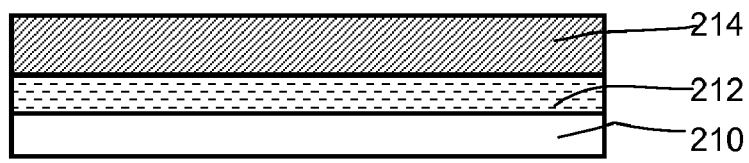
Figure 2C:
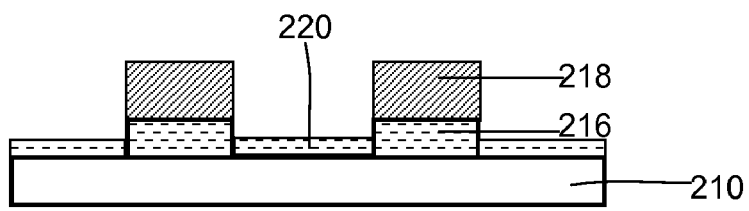
Figure 2D:
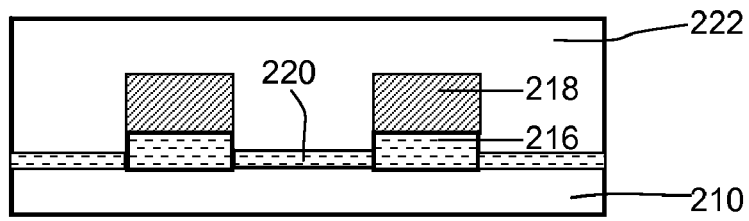
Figure 2E:
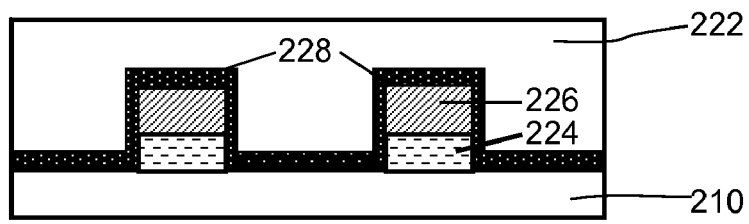
Figure 2F:
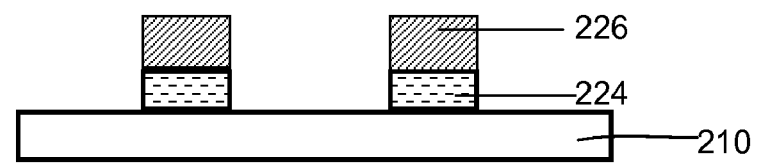

In another embodiment, a DBARC material is first applied to substrate 210 to provide a DBARC layer 212 (FIG. 2a). A photoresist layer 214 is then applied over the DBARC layer 212 (FIG. 2b). The substrate is pattern-wise exposed to a radiation and then developed with a first developer to form patterned structures 218 and 216 in the photoresist and DBARC layers (FIG. 2c). In FIG. 2c, DBARC residues 220 are primarily present in the open trench areas between the lines of the patterned structures. In FIG. 2d, a layer of a developer soluble material 222 is deposited over the patterned structures in the photoresist and DBARC layers. The substrate is baked to form a thin intermixing layer 228 at an interface between the photoresist and the developer soluble material as well as between the DBARC and the developer soluble material (FIG. 2e). A second developer is then used to remove the developer soluble material layer 222 and the thin intermixing layer 228 from the substrate, leaving patterned structures 226 and 224 in the photoresist and DBARC layers (FIG. 2f).

Figure 3A:
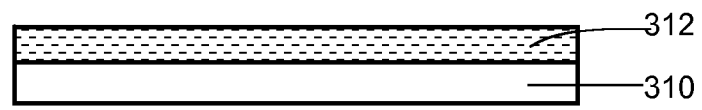
FIGS. 3a-3f illustrate cross-sectional views showing processing steps for removing residues from open areas of a patterned substrate using a developer soluble material for in accordance with still another embodiment of the present invention.
Figure 3B:
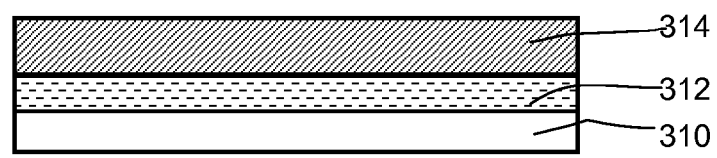
Figure 3C:
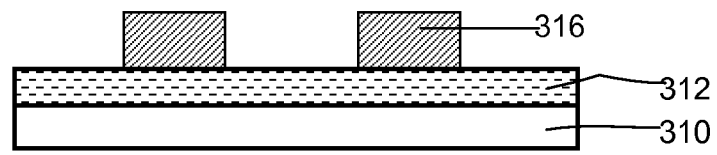
Figure 3D:
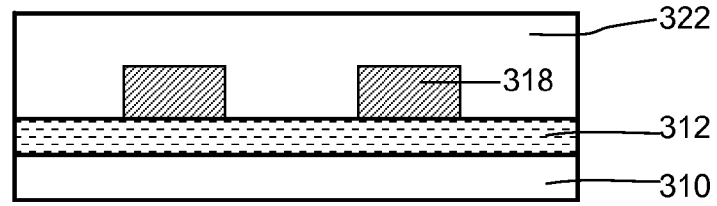
Figure 3E:
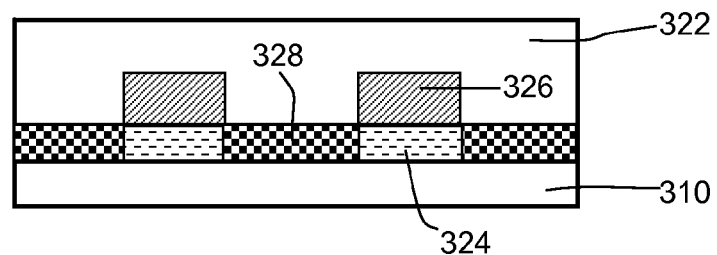
Figure 3F:
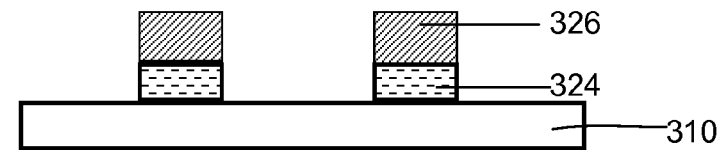

In still another embodiment, a BARC material is first applied to substrate 310 to provide a BARC layer 312 (FIG. 3a). A photoresist layer 314 is then applied over the BARC layer 312 (FIG. 3b). The substrate is pattern-wise exposed to a radiation and then developed with a first developer to form patterned structures 318 in the photoresist layer, revealing a section of the BARC layer 312 (FIG. 3c). In FIG. 3d, a layer of a developer soluble material 322 is deposited over the patterned structures in the photoresist and the revealed section of the BARC layer. The substrate is baked to form an intermixing layer 328 at an interface between the BARC and the developer soluble material (FIG. 3e). A second developer is then used to remove the developer soluble material layer 322 and the thin intermixing layer 328 from the substrate, leaving patterned structures 326 and 324 in the photoresist and BARC layers (FIG. 3f).

Figure 4A:
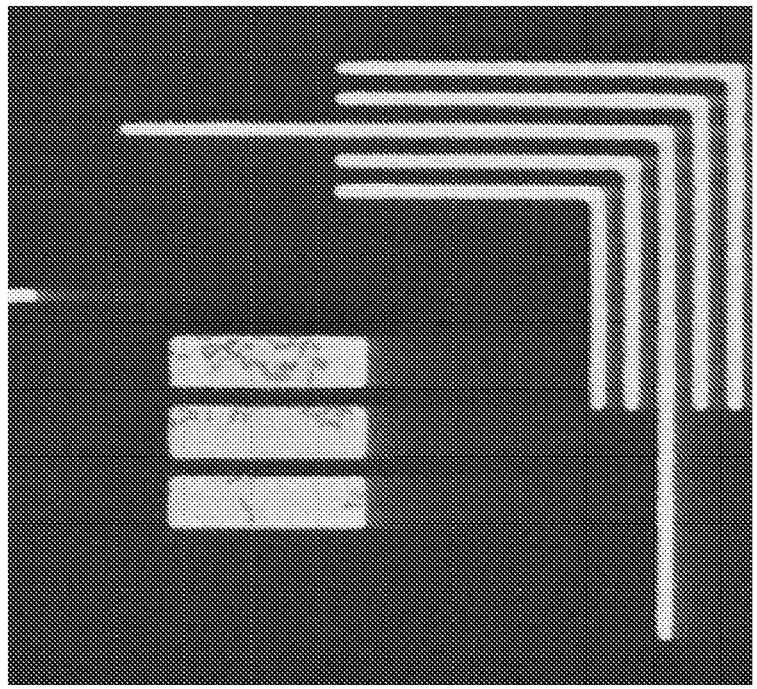
FIG. 4a is a scanning electron micrograph showing a top-down view of patterned resist structures before a layer of the developer soluble material is deposited.
Figure 4B:
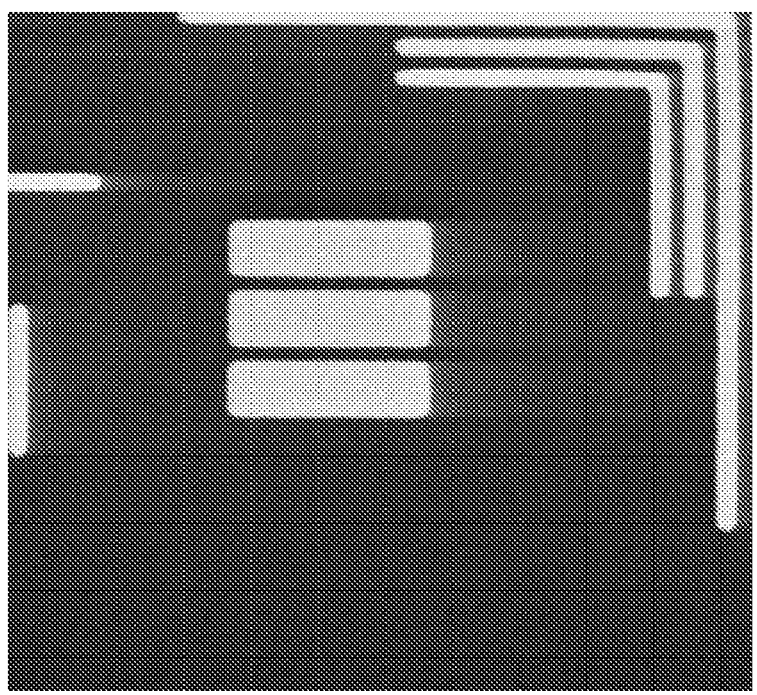
FIG. 4b is a scanning electron micrograph showing a top-down view of patterned resist structures after a layer of the developer soluble material is deposited and then removed with a developer.

FIG. 4a is a top-down view of patterned resist structures before the layer of the developer soluble material is deposited, which shows residues on top of the patterned structures. In contrast, FIG. 4b is a top-down view of patterned resist structures after a layer of the developer soluble material is deposited and then removed with a developer, in which the patterned structures are free of residues.

Figure 5A:
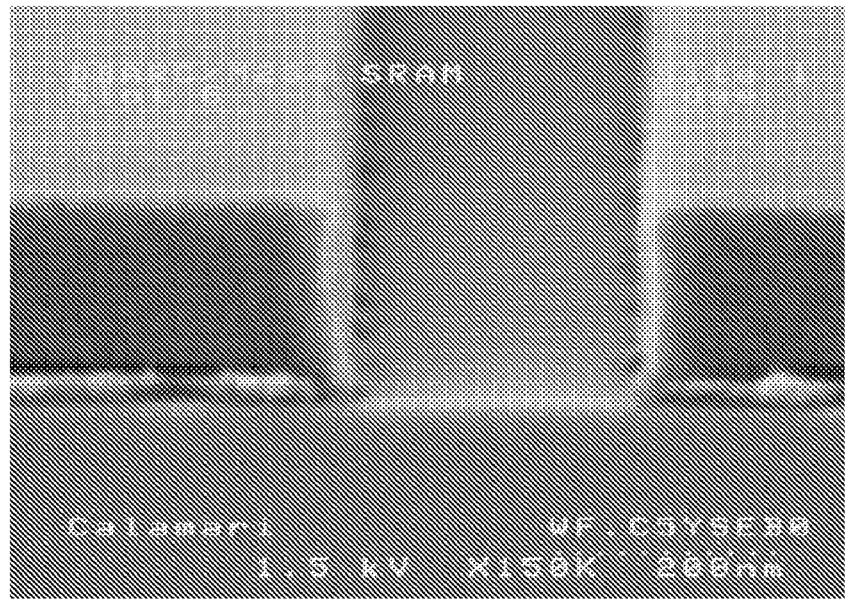
FIG. 5a is a scanning electron micrograph showing a cross-sectional view of patterned resist structures before a layer of the developer soluble material is deposited.
Figure 5B:
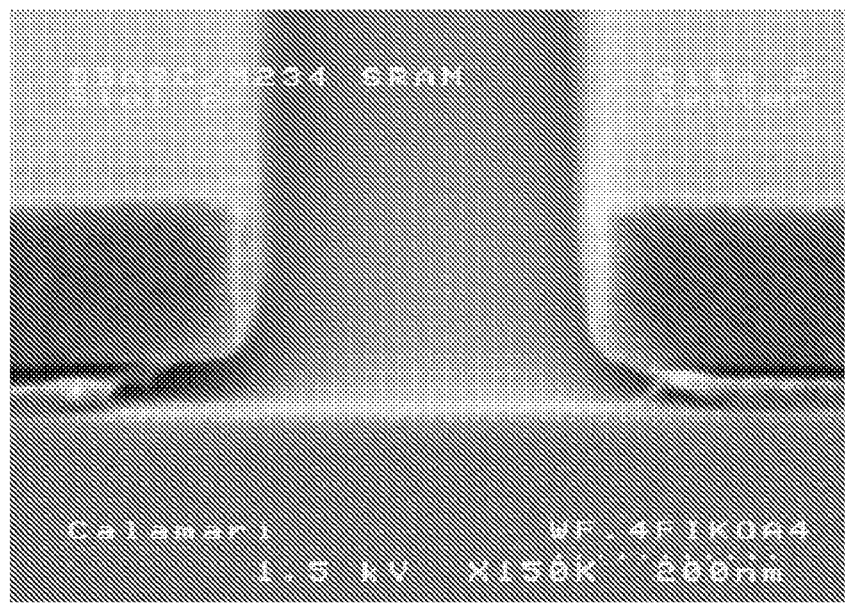
FIG. 5b is a scanning electron micrograph showing a cross-sectional view of patterned resist structures after a layer of the developer soluble material is deposited and then removed with a developer.

FIG. 5a is a cross-sectional view of patterned structures before the layer of the developer soluble material is deposited, which shows DBARC residues in the open trench area between the lines of the patterned structures. In contrast, FIG. 5b is a cross-sectional view of patterned structures after a layer of the developer soluble material is deposited and then removed with a developer, in which the patterned structures are free of DBARC residues.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A method for removing residues from open areas of a patterned substrate comprising:
    providing a layer of a developable bottom anti-reflective coating (DBARC) over a substrate;
    providing a layer of a photoresist over said DBARC layer;
    pattern-wise exposing said photoresist layer and said DBARC layer to a radiation;
    developing said photoresist layer and said DBARC layer with a first developer to form patterned structures in said photoresist and DBARC layers;
    depositing a layer of a developer soluble material over said patterned structures; and
    removing said developer soluble material with a second developer.

2. The method of claim 1, wherein said photoresist is a chemically amplified resist.

3. The method of claim 1, wherein said first and second developers are aqueous alkaline developers.

4. The method of claim 3, wherein said first and second developers both comprise a tetramethylammonium hydroxide (TMAH) developer solution.

5. The method of claim 1, wherein said developer soluble material comprises a polymer containing an acidic group.

6. The method of claim 5, wherein said acidic group comprises carboxylic acid, fluoroalcohol, and fluorosulfonamide.

7. The method of claim 1, wherein said developer soluble material layer is soluble in aqueous alkaline developers.

8. The method of claim 1, further comprising:
    baking said substrate after depositing said layer of said developer soluble material over said patterned structures.

9. The method of claim 1, further comprising:
    etching or ion implanting portions of said substrate not covered by said photoresist and said DBARC, thereby transferring said patterned structures into said substrate.

10. A method for removing residues from open areas on a patterned substrate comprising:
    providing a layer of a developable bottom anti-reflective coating (DBARC) over a substrate;
    providing a layer of a photoresist over said DBARC layer;
    pattern-wise exposing said photoresist layer and said DBARC layer to a radiation;
    developing said photoresist layer and said DBARC layer with a first developer to form patterned structures in said photoresist and DBARC layers;
    depositing a layer of a developer soluble material over said patterned structures;
    baking said substrate to form an intermixing layer at an interface between said photoresist and said developer soluble material as well as between said DBARC and said developer soluble material; and
    removing said developer soluble material and said intermixing layer with a second developer.

11. The method of claim 10, wherein the temperature of said baking step is from about 60° C. to about 250° C.

12. The method of claim 10, wherein said photoresist is a chemically amplified resist.

13. The method of claim 10, wherein said first and second developers are aqueous alkaline developers.

14. The method of claim 13, wherein said first and second developers both comprise a tetramethylammonium hydroxide (TMAH) developer solution.

15. The method of claim 10, wherein said developer soluble material comprises a polymer containing an acidic group.

16. The method of claim 15, wherein said acidic group comprises carboxylic acid, fluoroalcohol, and fluorosulfonamide.

17. The method of claim 10, wherein said developer soluble material layer is soluble in aqueous alkaline developers.

18. The method of claim 10, further comprising:
    etching or ion implanting portions of said substrate not covered by said photoresist and said DBARC, thereby transferring said patterned structures into said substrate.

19. A method for removing residues from open areas of a patterned substrate comprising:
    providing a layer of a bottom anti-reflective coating (BARC) over a substrate;
    providing a layer of a photoresist over said BARC layer;
    pattern-wise exposing said photoresist layer to a radiation;
    developing said photoresist layer with a first developer to form patterned structures in said photoresist layer, revealing a section of said BARC layer;
    depositing a layer of a developer soluble material over said patterned structures and said revealed section of said BARC layer;
    baking said substrate such that at least a portion of said exposed section of said BARC layer is rendered soluble in a second developer; and
    removing said developer soluble material and said at least portion of the revealed section of said BARC layer with said second developer.

20. The method of claim 19, further comprising:
    etching or ion implanting portions of said substrate not covered by said photoresist and said BARC, thereby transferring said patterned structures into said substrate.

* * * * *